US008526240B2

(12) United States Patent
Lo et al.

(10) Patent No.: US 8,526,240 B2
(45) Date of Patent: Sep. 3, 2013

(54) FLASH MEMORY AND MEMORY CELL PROGRAMMING METHOD THEREOF (75) Inventors: Chun-Yuan Lo, Hsinchu (TW); Wein-Town Sun, Taoyuan County (TW)

(73) Assignee: eMemory Technology Inc., Hsinchu (TW)

( * ) Notice: Subject to any disclaimer, the term of this patent is extended or adjusted under 35 U.S.C. 154(b) by 126 days.

(21) Appl. No.: 13/211,339

(22) Filed: Aug. 17, 2011

(65) Prior Publication Data

US 2013/0044548 A1    Feb. 21, 2013

(51) Int. Cl.
*G11C 16/06*    (2006.01)
(52) U.S. Cl.
USPC ............. 365/185.22; 365/185.24; 365/185.18

(58) Field of Classification Search
USPC ............................ 365/185.22, 185.18, 185.24
See application file for complete search history.

(56) References Cited

U.S. PATENT DOCUMENTS

| | | | | |
|---|---|---|---|---|
| 6,493,266 | B1 * | 12/2002 | Yachareni et al. | 365/185.22 |
| 7,397,704 | B2 * | 7/2008 | Sim | 365/185.22 |
| 7,649,782 | B2 * | 1/2010 | Eguchi et al. | 365/185.22 |
| 7,652,925 | B2 * | 1/2010 | Sim | 365/185.19 |
| 8,120,966 | B2 * | 2/2012 | Lee | 365/185.22 |

* cited by examiner

*Primary Examiner* — Pho M Luu
(74) *Attorney, Agent, or Firm* — Jianq Chyun IP Office (57) ABSTRACT

A programming method includes the following steps. A preset programming voltage is applied to a memory cell to program the memory cell. A first verify voltage is applied to the memory cell to detect a programming result of the memory cell. A programming voltage applied on the memory cell is adjusted according to the programming result of the memory cell. A flash memory is also provided.

10 Claims, 5 Drawing Sheets

FLASH MEMORY AND MEMORY CELL PROGRAMMING METHOD THEREOF

BACKGROUND

1. Field of the Invention

The invention relates to a flash memory. Particularly, the invention relates to a flash memory and a memory cell programming method thereof.

2. Description of Related Art

Since a flash memory has advantages of non-volatile, high density and fast response speed, etc, it becomes popular in various memories. Data storage of a memory is closely related to device reliability. In recent years, various data programming methods of the flash memory are provided to improve reliability of the flash memory.

Figure 1:
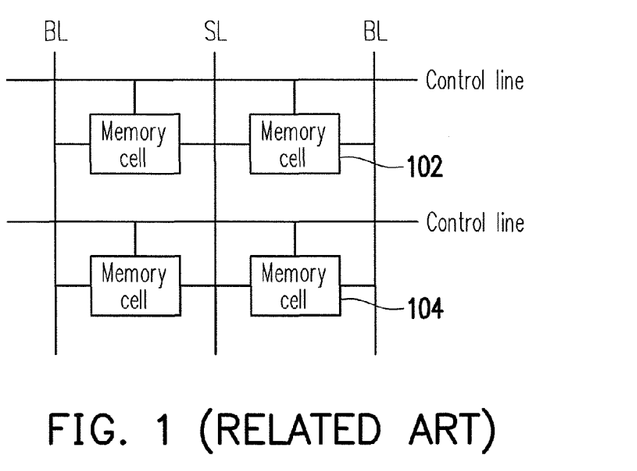
FIG. 1 is a schematic diagram of a memory cell array of a conventional flash memory.

When the flash memory is programmed, a high voltage is generally used to program data, though due to variations of the semiconductor manufacturing process, programming voltages required by memory cells in the flash memory are different. In order to correctly program data to each memory cell, a conventional method is to increase the programming voltage, though such method has a risk of reducing the reliability of the flash memory. FIG. 1 is a schematic diagram of a memory cell array of a conventional flash memory. As shown in FIG. 1, when a high voltage is applied to a bit line BL to program a memory cell 102, a memory cell 104 is also influenced by the high voltage, and electrons in the memory cell 104 gradually outflow from a drain, which influences the reliability of the flash memory. Moreover, by using the high programming voltage to program data to the flash memory, besides the reliability of the flash memory is influenced, disadvantages of wasting power, increasing a circuit area, and reducing a service life of the flash memory are also encountered.

SUMMARY OF THE INVENTION

The invention is directed to a memory cell programming apparatus and method of a flash memory, by which an influence caused by process variations during a programming operation can be reduced, so as to improve a product yield and ameliorate drain disturb.

The invention provides a memory cell programming method of a flash memory, which includes following steps. A preset programming voltage is applied to a memory cell to program the memory cell. A first verify voltage is applied to the memory cell to detect a programming result of the memory cell. A programming voltage applied on the memory cell is adjusted according to the programming result of the memory cell.

In an embodiment of the invention, the step of adjusting the programming voltage applied on the memory cell according to the programming result of the memory cell includes following steps. It is determined whether a threshold voltage of the memory cell is greater than or equal to a second verify voltage. The programming voltage is adjusted to a first programming voltage when the threshold voltage is greater than or equal to the second verify voltage. It is determined whether the threshold voltage is greater than or equal to a third verify voltage when the threshold voltage is smaller than the second verify voltage. The programming voltage is adjusted to a second programming voltage when the threshold voltage is greater than or equal to the third verify voltage. Moreover, the programming voltage is adjusted to a third programming voltage when the threshold voltage is smaller than the third verify voltage, where the first verify voltage is smaller than the second verify voltage and is greater than the third verify voltage, and the second programming voltage is greater than the first programming voltage and is smaller than the third programming voltage.

In an embodiment of the invention, the step of adjusting the programming voltage applied on the memory cell according to the programming result of the memory cell includes following steps. It is determined whether a threshold voltage of the memory cell is smaller than or equal to a second verify voltage. The programming voltage is adjusted to a first programming voltage when the threshold voltage is smaller than or equal to the second verify voltage. It is determined whether the threshold voltage is smaller than or equal to a third verify voltage when the threshold voltage is greater than the second verify voltage. The programming voltage is adjusted to a second programming voltage when the threshold voltage is smaller than or equal to the third verify voltage. Moreover, the programming voltage is adjusted to a third programming voltage when the threshold voltage is greater than the third verify voltage, where the first verify voltage is greater than the second verify voltage and is smaller than the third verify voltage, and the second programming voltage is smaller than the first programming voltage and is greater than the third programming voltage.

In an embodiment of the invention, the step of adjusting the programming voltage applied on the memory cell according to the programming result of the memory cell includes following steps. It is simultaneously determined whether a threshold voltage of the memory cell is greater than or equal to a second verify voltage and a third verify voltage, where the first verify voltage is smaller than the second verify voltage and is greater than the third verify voltage. Moreover, the programming voltage is adjusted according to comparison results of the threshold voltage and the second verify voltage and the third verify voltage.

In an embodiment of the invention, when the threshold voltage is greater than or equal to the second verify voltage and the third verify voltage, the programming voltage is adjusted to a first programming voltage. When the threshold voltage is greater than or equal to the third verify voltage and is smaller than the second verify voltage, the programming voltage is adjusted to a second programming voltage. When the threshold voltage is smaller than the second verify voltage and the third verify voltage, the programming voltage is adjusted to a third programming voltage, where the second programming voltage is greater than the first programming voltage and is smaller than the third programming voltage.

In an embodiment of the invention, the memory cell programming method of the flash memory further comprises detecting a read current of the memory cell, so as to detect the programming result of the memory cell.

The invention provides a flash memory including a programming verification unit and a programming voltage control unit. The programming verification unit is coupled to a memory cell for applying a preset programming voltage to the memory cell to program the memory cell, and applying a first verify voltage to the memory cell to detect a programming result of the memory cell. The programming voltage control unit is coupled to the programming verification unit and the memory cell, and is used for adjusting a programming voltage applied on the memory cell according to the programming result of the memory cell.

According to the above descriptions, in the invention, the programming voltage applied on the memory cell is adjusted according to the programming result of the memory cell of the flash memory, so as to reduce an influence caused by process variation during a programming operation, and improve a product yield and ameliorate drain disturb.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 2:
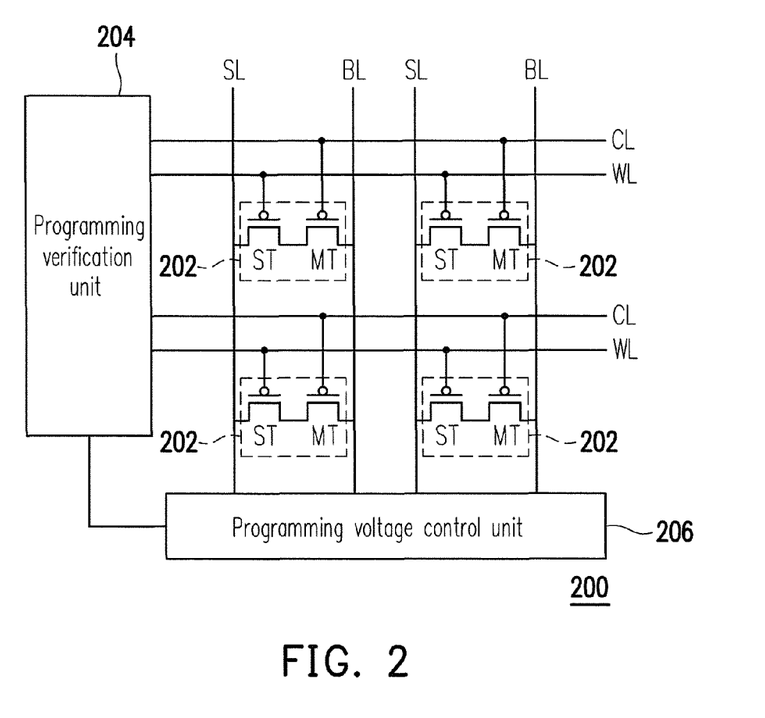
FIG. 2 is a schematic diagram of a flash memory according to an embodiment of the invention.

FIG. 2 is a schematic diagram of a flash memory according to an embodiment of the invention. Referring to FIG. 2, the flash memory 200 includes a memory cell array formed by plurality of memory cells 202 (for clarity's sake, only four memory cells 202 are illustrated), a programming verification unit 204 and a programming voltage control unit 206. Each of the memory cells 202 is coupled to the programming voltage control unit 206 through a source line SL and a bit line BL, and is coupled to the programming verification unit 204 through a control line CL and a word line WL. In the present embodiment, the memory cell 202 can be implemented by a selection transistor ST and a memory transistor MT (which are all, for example, P-type transistors), though implementation of the memory cell 202 is not limited thereto in actual applications. A source of the selection transistor ST is coupled to the source line SL, a gate of the selection transistor ST is coupled to the word line WL, and a drain of the selection transistor ST is coupled to a source of the memory transistor MT. Moreover, a gate and a drain of the memory transistor MT are respectively coupled to the control line CL and the bit line BL. The programming verification unit 204 is used for applying a preset programming voltage and a verify voltage to the memory cell 202 through the control line CL, and selecting to control the memory cell 202 to be programmed through the word line WL. The programming voltage control unit 206 is used for adjusting a programming voltage applied on the memory cell 202 according to a programming result detected by the programming verification unit 204.

It should be noticed that it is relatively difficult to provide a negative voltage as a control voltage for the transistors in practice, so the bit line BL is coupled to a ground voltage and the source line SL is coupled to a positive voltage, the programming operation of the memory cells 202 can be performed by adjusting the positive voltage coupled to the source line SL, and the invention is not limited thereto. In addition, in some embodiments, the programming voltage control unit 206 can also detects a read current on the bit line BL, so as to detect the programming result of the memory cell 202, and adjusts the programming voltage applied on the memory cell 202 according to the programming result of the memory cell 202.

Figure 3:
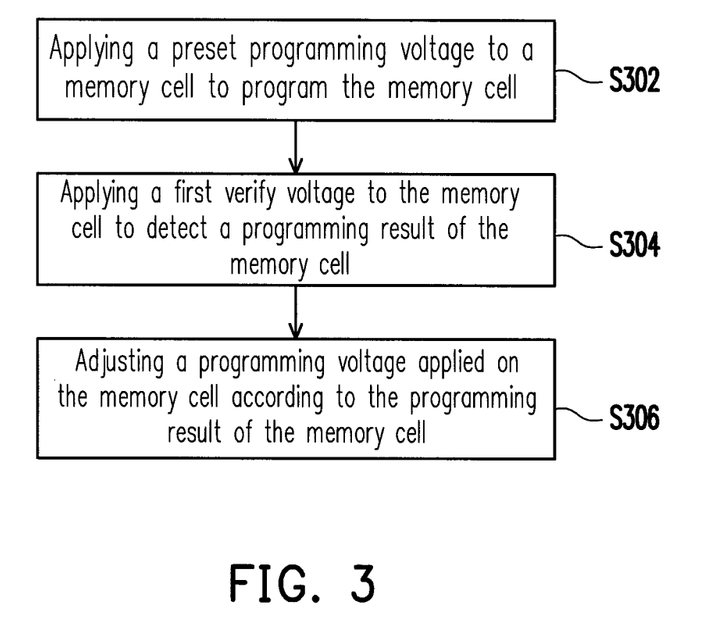
FIG. 3 is a flowchart illustrating a memory cell programming method of a flash memory according to an embodiment of the invention.

FIG. 3 is a flowchart illustrating a memory cell programming method of a flash memory according to an embodiment of the invention. The memory cell programming method of the flash memory 200 is described below with reference of FIG. 2 and FIG. 3. Referring to FIG. 2 and FIG. 3, first, in order to apply different programming voltages to the memory cells 202 according to different poly gate lengths of the memory cells 202 caused by process variations, the programming verification unit 204 applies a preset programming voltage to the memory cell 202 to program the memory cell 202 (step S302), and applies a first verify voltage to the memory cell 202 to detect a programming result of the memory cell (step S304). Wherein different poly gate lengths will lead to different threshold voltages obtained by applying the first verify voltage to the memory transistor MT in the memory cells 202. It should be noticed that the programming result of the memory cell 202 can also be obtained by detecting the read current of the memory cells 202.

Then, the programming voltage control unit 206 adjusts a programming voltage applied on the memory cell 202 according to the programming result detected by the programming verification unit 204 (step S306). For example, a relatively large programming voltage is applied to the memory cell 202 with a smaller threshold voltage (longer poly gate length), and a relatively small programming voltage is applied to the memory cell 202 with a larger threshold voltage (shorter poly gate length). In this way, by applying programming voltages corresponding to different threshold voltages to the memory cells 202, data can be correctly programmed to each of the memory cells 202, so as to improve a production yield, reduce the drain disturb, reduce a programming current and enhance durability and reliability of the memory cells 202.

Figure 4:
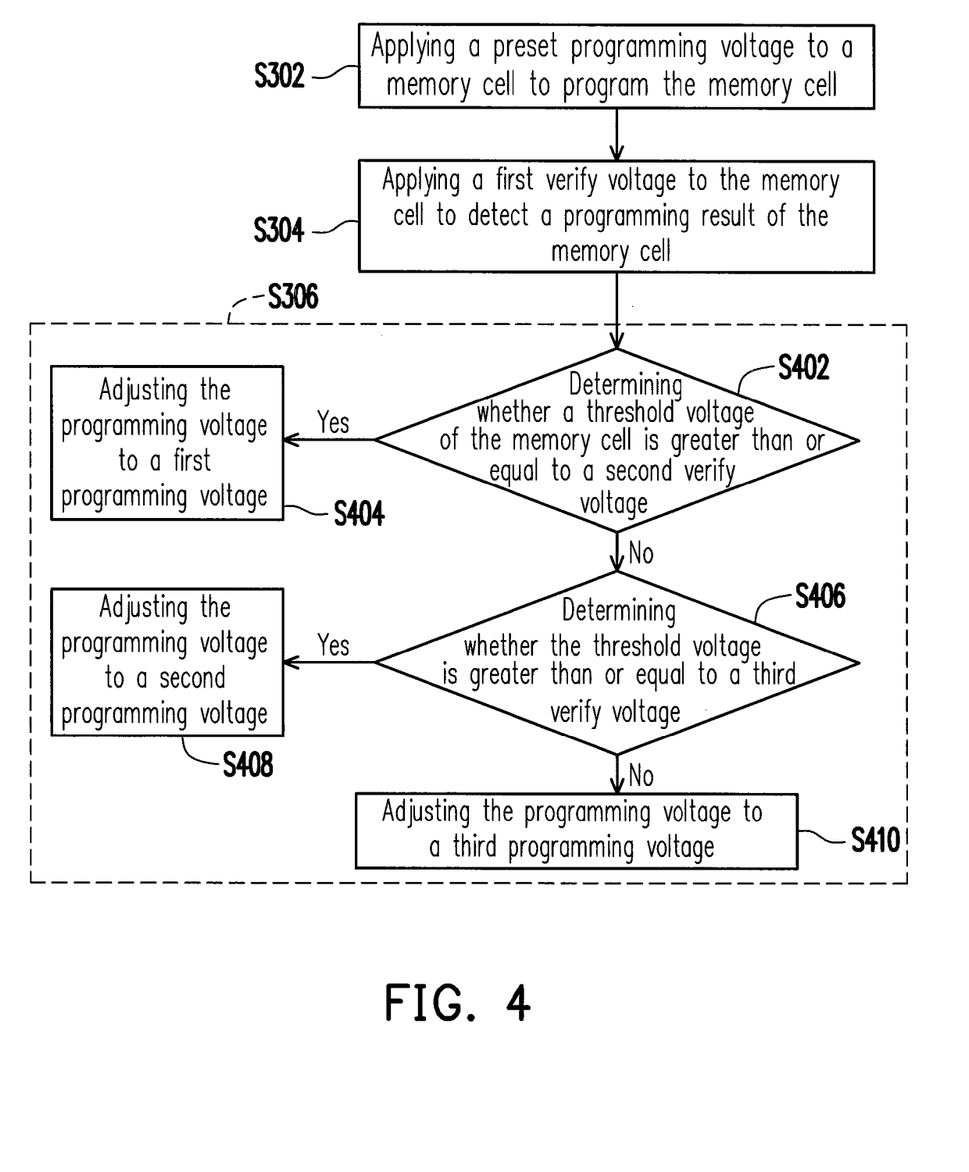
FIG. 4 is a flowchart illustrating a memory cell programming method of a flash memory according to another embodiment of the invention.

In detail, a method that the programming voltage control unit 206 adjusts the programming voltage according to the programming result detected by the programming verification unit 204 (i.e. the step S306) is as that shown in FIG. 4. After the programming result of the memory cell 202 is detected, the programming voltage control unit 206 determines whether a threshold voltage of the memory cell 202 is greater than or equal to a second verify voltage (step S402). When the threshold voltage is greater than or equal to the second verify voltage, the programming voltage control unit 206 adjusts the programming voltage to a first programming voltage (step S404). When the threshold voltage is smaller than the second verify voltage, the programming voltage control unit 206 continually determines whether the threshold voltage is greater than or equal to a third verify voltage (S406). When the threshold voltage is greater than or equal to the third verify voltage, the programming voltage control unit 206 adjusts the programming voltage to a second programming voltage (step S408). When the threshold voltage is smaller than the third verify voltage, the programming voltage control unit 206 adjusts the programming voltage to a third programming voltage (step S410), where the first verify voltage is smaller than the second verify voltage and is greater than the third verify voltage, and the second programming voltage is greater than the first programming voltage and is smaller than the third programming voltage. The threshold voltage can be divided into three sections through the second verify voltage and the third verify voltage, and each section corresponds to a programming voltage.

For example, the second verify voltage and the third verify voltage can be respectively set to 4V and 2V, where the programming voltage of the memory cell 202 with the threshold voltage higher than 4V is adjusted to 4.5V (i.e. the first programming voltage), the programming voltage of the memory cell 202 with the threshold voltage between 4V and 2V is adjusted to 5V (i.e. the second programming voltage), and the programming voltage of the memory cell 202 with the threshold voltage lower than 2V is adjusted to 5.5V. Moreover, the preset programming voltage of the step S302 and the first verify voltage of the step S304 can be respectively set to 5V and 3V, though the invention is not limited thereto.

Figure 5A:
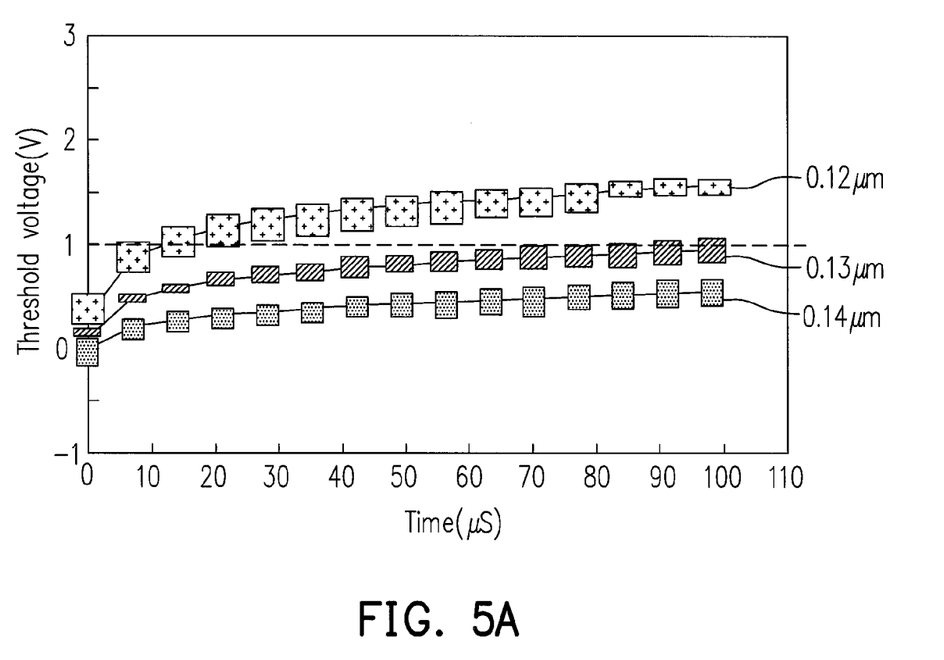
FIG. 5A is a schematic diagram of drain disturb of a conventional memory cell programming method.
Figure 5B:
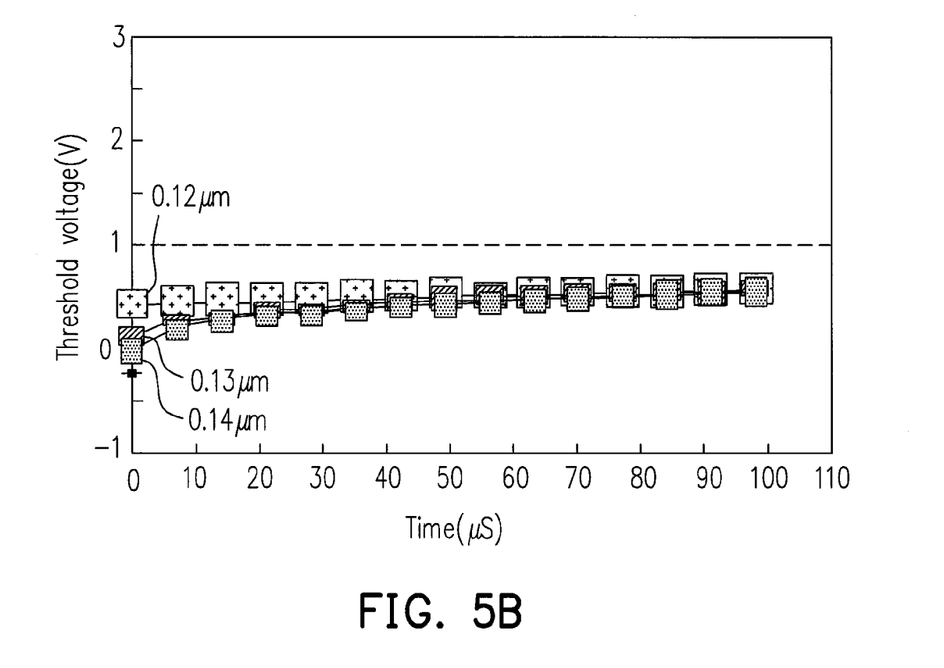
FIG. 5B is a schematic diagram of drain disturb mitigated according to a memory cell programming method of an embodiment of the invention.

FIG. 5A is a schematic diagram of drain disturb of a conventional memory cell programming method. FIG. 5B is a schematic diagram of drain disturb mitigated according to a memory cell programming method of an embodiment of the invention. As shown in FIG. 5A, it is assumed that the threshold voltage of the memory cell 202 is smaller than 1V when it is not selected for the programming operation. In order to correctly program data to the memory cells 202 with different poly gate lengths, the programming voltage has to be pulled up to a voltage required by the memory cell 202 with the longest poly gate length, though it may cause that the memory cell 202 with a shorter poly gate length (with a length of 0.12 μm) is influenced by the high voltage on the bit line BL when the adjacent memory cell is programmed, and lead to a fact that the threshold voltage is increased to be greater than 1V, so that the electrons in the memory cell 202 may outflow through the drain of the transistor, which influences the reliability of the memory cells 202. According to FIG. 5B, by applying different programming voltages to the memory cells 202 with different poly gate lengths, the thresholds of the memory cells 202 with different poly gate lengths are all maintained to be lower than 1V. It can be seen that the memory cell programming method showed in present embodiment greatly improves the reliability of the memory cells 202.

It should be noticed that the verify voltages and the programming voltage of the present embodiment are only used as an example, and the invention is not limited thereto. Moreover, the verify voltages used for dividing the threshold voltage of the memory 202 are not limited to the second verify voltage and the third verify voltage, and the user can design more verify voltages according to an actual application requirement, so as to divide the threshold voltage of the memory cell 202 into more sections, and design more programming voltages corresponding to the sections.

Figure 6:
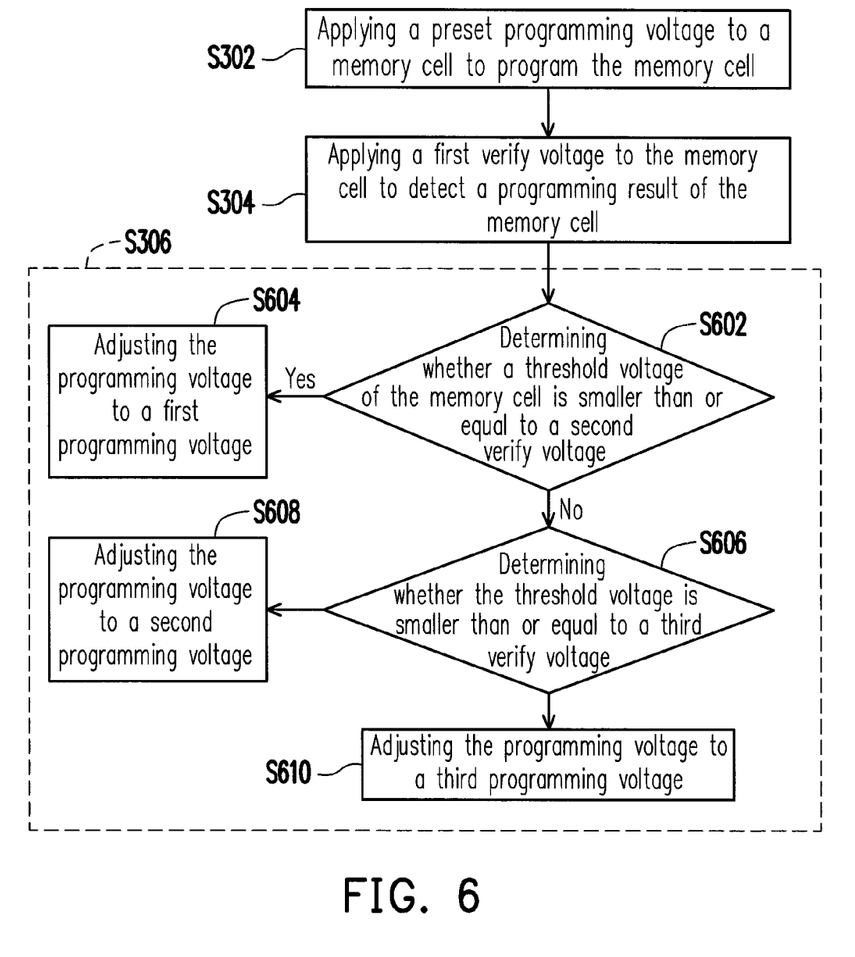
FIG. 6 is a flowchart illustrating a memory cell programming method of a flash memory according to another embodiment of the invention.

FIG. 6 is a flowchart illustrating a memory cell programming method of a flash memory according to another embodiment of the invention. Referring to FIG. 6, a difference between the memory cell programming methods of FIG. 4 and FIG. 6 is that in the embodiment of FIG. 4, the verify voltages are sequentially compared to the threshold voltage from the larger verify voltage to the smaller verify voltage to determine the programming voltages, while in FIG. 6, the verify voltages are sequentially compared to the threshold voltage from the smaller verify voltage to the larger verify voltage to determine the programming voltages.

As shown in FIG. 6, after the programming result of the memory cell 202 is detected, the programming voltage control unit 206 determines whether the threshold voltage of the memory cell 202 is smaller than or equal to a second verify voltage (step S602). When the threshold voltage is smaller than or equal to the second verify voltage, the programming voltage control unit 206 adjusts the programming voltage to a first programming voltage (step S604). When the threshold voltage is greater than the second verify voltage, the programming voltage control unit 206 continually determines whether the threshold voltage is smaller than or equal to a third verify voltage (S606). When the threshold voltage is smaller than or equal to the third verify voltage, the programming voltage control unit 206 adjusts the programming voltage to a second programming voltage (step S608). When the threshold voltage is greater than the third verify voltage, the programming voltage control unit 206 adjusts the programming voltage to a third programming voltage (step S610), where the first verify voltage is greater than the second verify voltage and is smaller than the third verify voltage, and the second programming voltage is smaller than the first programming voltage and is greater than the third programming voltage.

Therefore, a higher programming voltage can be applied to the memory cell 202 with a lower threshold voltage, and a lower program voltage can be applied to the memory cell 202 with a higher threshold voltage, so as to reduce the influence caused by process variations during the programming operation.

Figure 7:
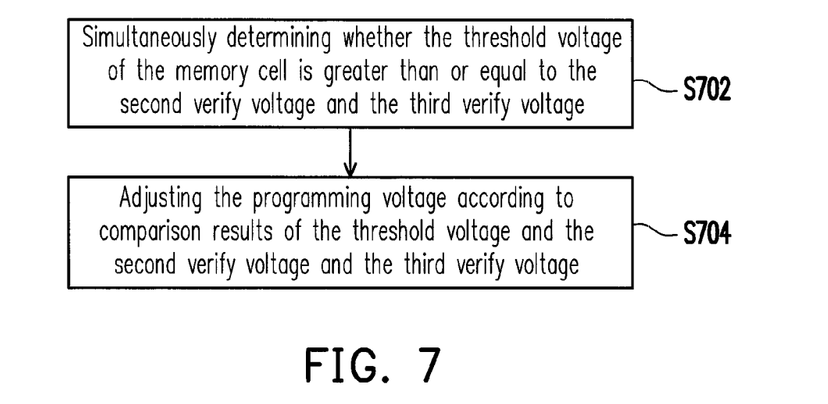
FIG. 7 is a flowchart illustrating a memory cell programming method of a flash memory according to another embodiment of the invention.

FIG. 7 is a flowchart illustrating a memory cell programming method of a flash memory according to another embodiment of the invention. Referring to FIG. 7, a difference between the memory cell programming method of the present embodiment and the memory cell programming method of the embodiment of FIG. 4 is that in the memory cell programming method of the present embodiment, it is simultaneously determined whether the threshold voltage of the memory cell 202 is greater than or equal to the second verify voltage and the third verify voltage (step S702). Then, the programming voltage is adjusted according to comparison results of the threshold voltage and the second verify voltage and the third verify voltage (step S704). When the threshold voltage is greater than or equal to the second verify voltage and the third verify voltage, the programming voltage is adjusted to a first programming voltage. When the threshold voltage is greater than or equal to the third verify voltage and smaller than the second verify voltage, the programming voltage is adjusted to a second programming voltage. When the threshold voltage is smaller than the second verify voltage and the third verify voltage, the programming voltage is adjusted to a third programming voltage, wherein the second programming voltage is greater than the first programming voltage and is smaller than the third programming voltage.

In the present embodiment, a circuit for adjusting the programming voltage according to the comparison results of the threshold voltage and the second verify voltage and the third verify voltage can be implemented by a logic gate. For example, when the threshold voltage is greater than or equal to the second verify voltage, the comparison result of the threshold voltage and the second verify voltage is set to "1", and when the threshold voltage is smaller than the second verify voltage, the comparison result of the threshold voltage and the second verify voltage is set to "0". Similarly, when the threshold voltage is greater than or equal to the third verify voltage, the comparison result of the threshold voltage and the third verify voltage is set to "1", and when the threshold voltage is smaller than the third verify voltage, the comparison result of the threshold voltage and the third verify voltage is set to "0". In this way, the programming voltage control unit 206 can adjust the programming voltage according to the comparison results of the threshold voltage and the second verify voltage and the third verify voltage, i.e. when the comparison results are "11", the programming voltage is adjusted to the first programming voltage, when the comparison results are "10", the programming voltage is adjusted to the second programming voltage, and when the comparison results are "00", the programming voltage is adjusted to the third programming voltage.

In summary, in the invention, the programming results of the memory cells of the flash memory are detected, and different programming voltages are applied to the memory cells with different threshold voltages according to the programming results of the memory cells, so as to reduce the influence caused by process variation during the programming operation, and meanwhile ensure that data can be correctly programmed into each memory cell, and improve a production yield, reduce the drain disturb, reduce a programming current and enhance durability and reliability of the memory cells.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory cell programming method of a flash memory, comprising:
    applying a preset programming voltage to a memory cell to program the memory cell;
    applying a first verify voltage to the memory cell to detect a programming result of the memory cell; and
    adjusting a programming voltage applied on the memory cell according to the programming result of the memory cell, the step comprising:
        determining whether a threshold voltage of the memory cell is greater than or equal to a second verify voltage;
        adjusting the programming voltage to a first programming voltage when the threshold voltage is greater than or equal to the second verify voltage;
        determining whether the threshold voltage is greater than or equal to a third verify voltage when the threshold voltage is smaller than the second verify voltage;
        adjusting the programming voltage to a second programming voltage when the threshold voltage is greater than or equal to the third verify voltage; and
        adjusting the programming voltage to a third programming voltage when the threshold voltage is smaller than the third verify voltage, wherein the first verify voltage is smaller than the second verify voltage and is greater than the third verify voltage, and the second programming voltage is greater than the first programming voltage and is smaller than the third programming voltage.

2. The memory cell programming method of the flash memory as claimed in claim 1 further comprises:
    detect a read current of the memory cell, so as to detect the programming result of the memory cell.

3. A memory cell programming method of a flash memory, comprising:
    applying a preset programming voltage to a memory cell to program the memory cell;
    applying a first verify voltage to the memory cell to detect a programming result of the memory cell; and
    adjusting a programming voltage applied on the memory cell according to the programming result of the memory cell, the step comprising:
        determining whether a threshold voltage of the memory cell is smaller than or equal to a second verify voltage;
        adjusting the programming voltage to a first programming voltage when the threshold voltage is smaller than or equal to the second verify voltage;
        determining whether the threshold voltage is smaller than or equal to a third verify voltage when the threshold voltage is greater than the second verify voltage;
        adjusting the programming voltage to a second programming voltage when the threshold voltage is smaller than or equal to the third verify voltage; and
        adjusting the programming voltage to a third programming voltage when the threshold voltage is greater than the third verify voltage, wherein the first verify voltage is greater than the second verify voltage and is smaller than the third verify voltage, and the second programming voltage is smaller than the first programming voltage and is greater than the third programming voltage.

4. A memory cell programming method of a flash memory, comprising:
    applying a preset programming voltage to a memory cell to program the memory cell;
    applying a first verify voltage to the memory cell to detect a programming result of the memory cell; and
    adjusting a programming voltage applied on the memory cell according to the programming result of the memory cell, the step comprising:
        simultaneously determining whether a threshold voltage of the memory cell is greater than or equal to a second verify voltage and a third verify voltage, wherein the first verify voltage is smaller than the second verify voltage and is greater than the third verify voltage; and
        adjusting the programming voltage according to comparison results of the threshold voltage and the second verify voltage and the third verify voltage.

5. The memory cell programming method of the flash memory as claimed in claim 4, wherein when the threshold voltage is greater than or equal to the second verify voltage and the third verify voltage, the programming voltage is adjusted to a first programming voltage, when the threshold voltage is greater than or equal to the third verify voltage and is smaller than the second verify voltage, the programming voltage is adjusted to a second programming voltage, and when the threshold voltage is smaller than the second verify voltage and the third verify voltage, the programming voltage is adjusted to a third programming voltage, wherein the second programming voltage is greater than the first programming voltage and is smaller than the third programming voltage.

6. A flash memory, comprising:
    a programming verification unit, coupled to a memory cell, for applying a preset programming voltage to the memory cell to program the memory cell, and applying a first verify voltage to the memory cell to detect a programming result of the memory cell; and
    a programming voltage control unit, coupled to the programming verification unit and the memory cell, for adjusting a programming voltage applied on the memory cell according to the programming result of the memory cell, wherein the programming voltage control unit further determines whether a threshold voltage of the memory cell is greater than or equal to a second verify voltage, wherein the programming voltage control unit adjusts the programming voltage to a first programming voltage when the threshold voltage is greater than or equal to the second verify voltage, determines whether the threshold voltage is greater than or equal to a third verify voltage when the threshold voltage is smaller than the second verify voltage, adjusts the programming voltage to a second programming voltage when the threshold voltage is greater than or equal to the third verify voltage, and adjusts the programming voltage to a third programming voltage when the threshold voltage is smaller than the third verify voltage, wherein the first verify voltage is smaller than the second verify voltage and is greater than the third verify voltage, and the second programming voltage is greater than the first programming voltage and is smaller than the third programming voltage.

7. The flash memory as claimed in claim 6, wherein the programming voltage control unit further detects a read current of the memory cell, so as to detect the programming result of the memory cell, and adjusts the programming voltage applied on the memory cell according to the programming result of the memory cell.

8. A flash memory, comprising:
a programming verification unit, coupled to a memory cell, for applying a preset programming voltage to the memory cell to program the memory cell, and applying a first verify voltage to the memory cell to detect a programming result of the memory cell; and
a programming voltage control unit, coupled to the programming verification unit and the memory cell, for adjusting a programming voltage applied on the memory cell according to the programming result of the memory cell, wherein the programming voltage control unit further determines whether a threshold voltage of the memory cell is smaller than or equal to a second verify voltage, wherein the programming voltage control unit adjusts the programming voltage to a first programming voltage when the threshold voltage is smaller than or equal to the second verify voltage, determines whether the threshold voltage is smaller than or equal to a third verify voltage when the threshold voltage is greater than the second verify voltage, adjusts the programming voltage to a second programming voltage when the threshold voltage is smaller than or equal to the third verify voltage, and adjusts the programming voltage to a third programming voltage when the threshold voltage is greater than the third verify voltage, wherein the first verify voltage is greater than the second verify voltage and is smaller than the third verify voltage, and the second programming voltage is smaller than the first programming voltage and is greater than the third programming voltage.

9. A flash memory, comprising:
a programming verification unit, coupled to a memory cell, for applying a preset programming voltage to the memory cell to program the memory cell, and applying a first verify voltage to the memory cell to detect a programming result of the memory cell; and
a programming voltage control unit, coupled to the programming verification unit and the memory cell, for adjusting a programming voltage applied on the memory cell according to the programming result of the memory cell, wherein the programming voltage control unit further simultaneously determines whether a threshold voltage of the memory cell is greater than or equal to a second verify voltage and a third verify voltage, wherein the first verify voltage is smaller than the second verify voltage and is greater than the third verify voltage, and adjusts the programming voltage according to comparison results of the threshold voltage and the second verify voltage and the third verify voltage.

10. The flash memory as claimed in claim 9, wherein when the threshold voltage is greater than or equal to the second verify voltage and the third verify voltage, the programming voltage control unit adjusts the programming voltage to a first programming voltage, when the threshold voltage is greater than or equal to the third verify voltage and is smaller than the second verify voltage, the programming voltage control unit adjusts the programming voltage to a second programming voltage, and when the threshold voltage is smaller than the second verify voltage and the third verify voltage, the programming voltage control unit adjusts the programming voltage to a third programming voltage, wherein the second programming voltage is greater than the first programming voltage and is smaller than the third programming voltage.

* * * * *